(12) United States Patent
Hayashi et al.

(10) Patent No.: US 7,679,930 B2
(45) Date of Patent: Mar. 16, 2010

(54) MULTILAYERED PRINTED CIRCUIT BOARD

(75) Inventors: Seiji Hayashi, Yokohama (JP); Hideho Inagawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/245,988

(22) Filed: Oct. 6, 2008

(65) Prior Publication Data
US 2009/0040741 A1   Feb. 12, 2009

Related U.S. Application Data

(62) Division of application No. 11/219,114, filed on Sep. 2, 2005, now Pat. No. 7,466,560.

(30) Foreign Application Priority Data

Sep. 7, 2004 (JP) ............................. 2004-259981
Dec. 16, 2004 (JP) ............................. 2004-364786
Jul. 20, 2005 (JP) ............................. 2005-209882

(51) Int. Cl.
*H05K 1/11* (2006.01)
*H05K 1/14* (2006.01)

(52) U.S. Cl. ...................... 361/784; 361/780; 361/782; 361/794; 361/795

(58) Field of Classification Search ......... 361/763–765, 361/780–784, 792–795
See application file for complete search history.

(56) References Cited

U.S. PATENT DOCUMENTS

| | | | | |
|---|---|---|---|---|
| 5,719,750 A | * | 2/1998 | Iwane | 361/794 |
| 5,912,809 A | * | 6/1999 | Steigerwald et al. | 361/780 |
| 6,084,779 A | * | 7/2000 | Fang | 361/763 |
| 6,166,457 A | * | 12/2000 | Iguchi et al. | 307/91 |
| 6,473,312 B1 | * | 10/2002 | Hiratsuka et al. | 361/794 |
| 6,535,398 B1 | * | 3/2003 | Moresco | 361/792 |
| 6,768,650 B2 | * | 7/2004 | Devey | 361/782 |

* cited by examiner

*Primary Examiner*—Tuan T Dinh
(74) *Attorney, Agent, or Firm*—Canon U.S.A., Inc. I.P. Division (57) ABSTRACT

A multilayered printed circuit board includes a first surface layer that includes a semiconductor integrated circuit, a second surface layer that includes a bypass capacitor and that is opposite to the first surface layer, a main power supply wiring layer, and a ground layer between the first and second surface layers. In the multilayered printed circuit board, one terminal of the bypass capacitor is connected to a midpoint of a wiring path from the main power supply wiring layer to a power supply terminal of the semiconductor integrated circuit, and an impedance of a first wiring path from the main power supply wiring layer to the terminal of the bypass capacitor is higher than an impedance of a second wiring path from the terminal of the bypass capacitor to the power supply terminal of the semiconductor integrated circuit.

9 Claims, 7 Drawing Sheets

MULTILAYERED PRINTED CIRCUIT BOARD

CROSS REFERENCE TO RELATED APPLICATIONS

The present application is a divisional of U.S. patent application Ser. No. 11/219,114, filed on Sep. 2, 2005, entitled "MULTILAYERED PRINTED CIRCUIT BOARD", the content of which is expressly incorporated by reference herein in its entirety. This application also claims priority from Japanese Patent Applications No. 2004-259981 filed Sep. 7, 2004, No. 2004-364786 filed Dec. 16, 2004, and No. 2005-209882 filed Jul. 20, 2005, which are hereby incorporated by reference herein in their entirety.

BACKGROUND OF THE INVENTION

1. Field of the Invention

The present invention relates to multilayered printed circuit boards including semiconductor integrated circuits (IC/LSI) and bypass capacitors.

2. Description of the Related Art

Recently, higher functionality has been required for electronic devices, and thus higher integration and higher processing speed of a semiconductor integrated circuit (IC/LSI), for example, an application specific integrated circuit (ASIC), mounted on a printed circuit board, have been developed to meet this requirement.

However, on the other hand, higher integration and higher processing speed of a semiconductor integrated circuit cause changes in power supply and ground potential, radiated noise, or the like, which leads to serious problems, for example, an adverse effect on other electronic devices and malfunction of the circuit itself. That is to say, a semiconductor integrated circuit requires a large current due to higher integration, and thus small inductance in a power supply pattern in a printed circuit board causes a large change in power supply voltage. Moreover, radiated noise is caused by changes in power supply and ground potential of a semiconductor integrated circuit, a change in common mode voltage to which the changes in power supply and ground potential are converted on a printed circuit board, and the like.

To solve these problems, hereto, a bypass capacitor has been located near an integrated circuit. A bypass capacitor is a capacitor serving as a virtual power supply that supplies electrical charge to an integrated circuit from the vicinity of the integrated circuit.

According to the disclosure in Japanese Patent Laid-Open No. 9-139573, bypass capacitors are located as close to power supply terminals of integrated circuits as possible, and radiated noise is suppressed by providing inductances between main power supply wiring and the integrated circuits.

Figure 9:
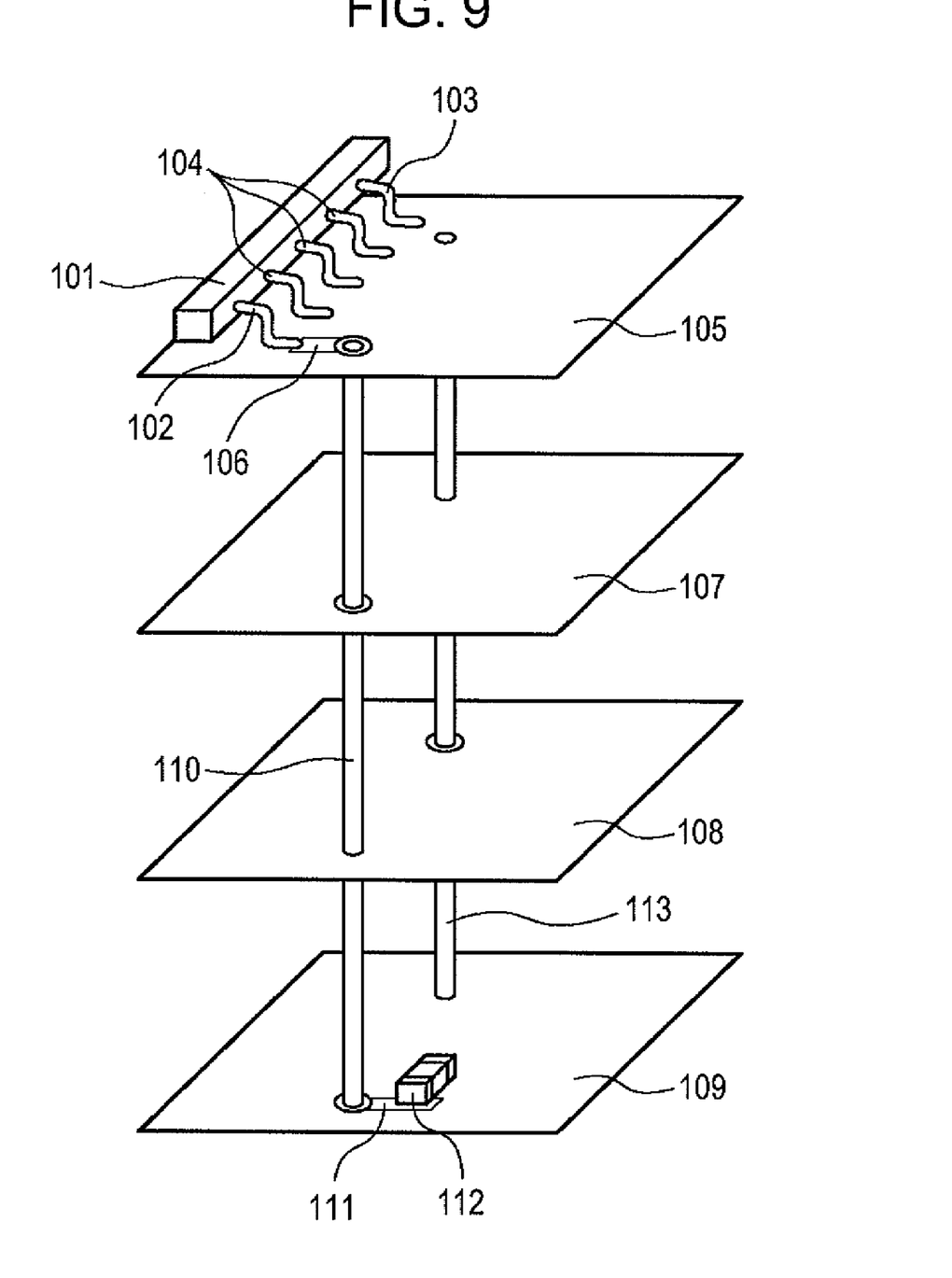
FIG. 9 is a schematic diagram showing a known printed circuit board.

Moreover, recently, semiconductor packages including several hundreds of pins, for example, a ball grid array (BGA) and a quad flat package (QFP), have been used. A large portion of the area around such a semiconductor package is occupied by lead-out signal lines, and it is difficult to install the power supply wiring pattern disclosed in the document described above. Thus, a multilayered printed circuit board as shown in FIG. 9 is used. In this multilayered printed circuit board, power supply wiring extends through a via hole (a through hole) to the back face of the printed circuit board, and a bypass capacitor is mounted on the back face of the printed circuit board.

In FIG. 9, the multilayered printed circuit board includes an integrated circuit (IC) 101 that generates noise, a power supply terminal 102 that supplies power to the IC 101, a ground terminal 103 that supplies a reference potential to the IC 101, and I/O terminals 104 having predetermined functions for the IC 101. The printed circuit board further includes a first surface-layer conductor 105 on which the IC 101 is mounted, first power supply wiring installed in the first surface-layer conductor 105, and an inner-layer ground conductor 107. The printed circuit board further includes an inner-layer main power supply plane 108 that constitutes a power supply system of the printed circuit board and a second surface-layer conductor on a face of the printed circuit board opposite to a face of the printed circuit board on which the first surface-layer conductor 105 is provided. The printed circuit board further includes a power-supply via hole (a through hole) 110 that extends from the first surface-layer conductor 105 to the second surface-layer conductor 109 and that connects to the inner-layer main power supply plane 108, and second power supply wiring 111 that extends to the second surface-layer conductor 109 out of the power-supply via hole 110. The printed circuit board further includes a bypass capacitor 112 mounted on the second surface-layer conductor 109, and a ground via hole 113 that constitutes the shortest path for a current through the bypass capacitor to go back to the ground terminal 103. Although the bypass capacitor 112 is actually disposed on the back face of the second surface-layer conductor 109, the bypass capacitor 112 is disposed on the front face of the second surface-layer conductor 109 in FIG. 9 for the sake of simplifying the illustration.

Figure 10:
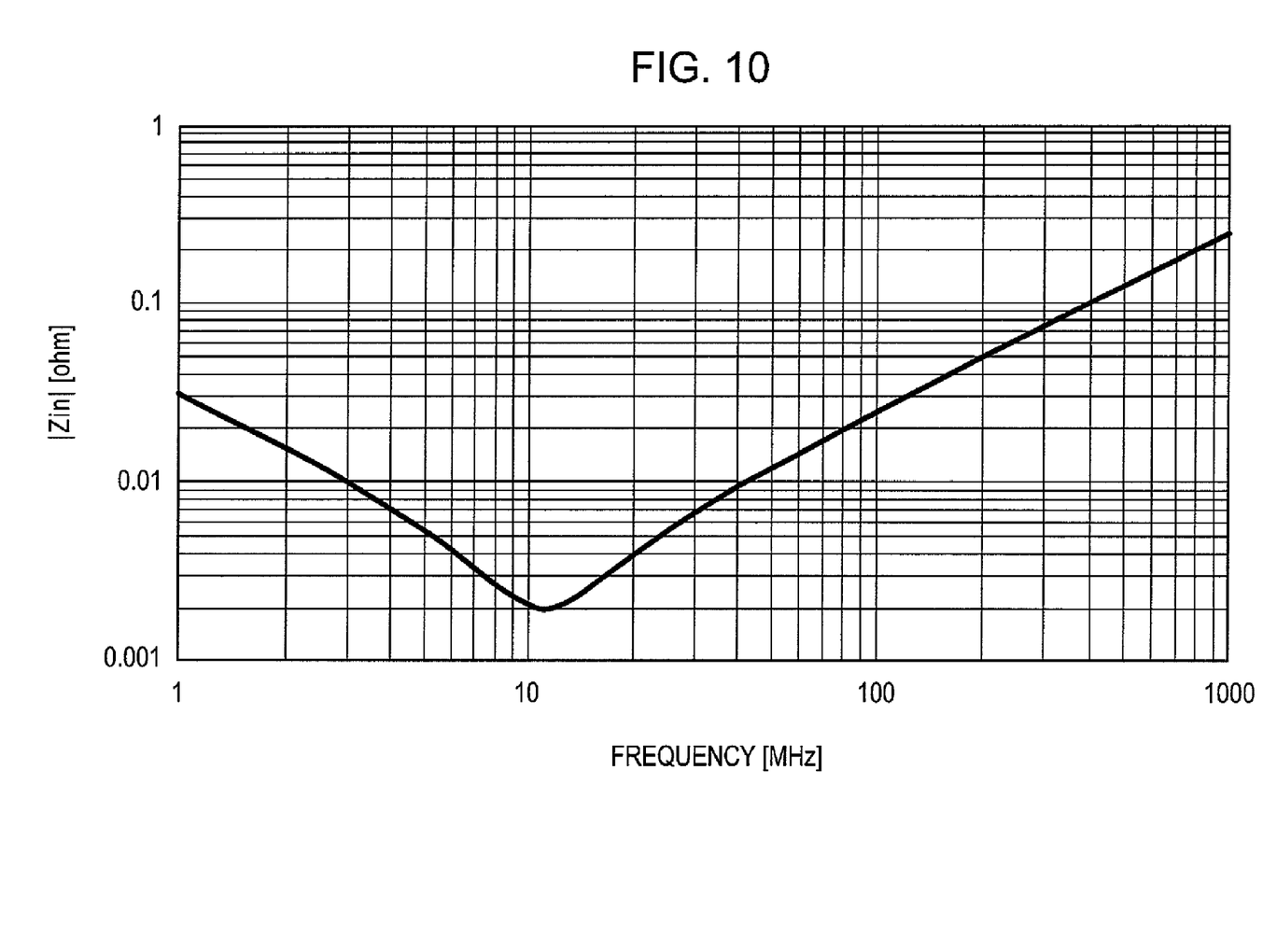
FIG. 10 is a graph showing impedance characteristics of a known bypass capacitor.

An ideal bypass capacitor has characteristics such that the impedance decreases as the frequency increases. However, an actual capacitor has impedance characteristics of an equivalent circuit represented by an inductance-capacitance-resistance (LCR) series circuit, as shown in FIG. 10, because a parasitic inductance, a parasitic resistance, and the like are generated. FIG. 10 shows impedance characteristics of a bypass capacitor having a capacitance value of 0.1° F. The parasitic inductance of a ceramic chip capacitor ranges from about 0.5 to 1.5 nH, and the resonant frequency of a bypass capacitor that has a capacitance value of 0.1° F., which is often used, is more than 10 Mhz.

Accordingly, at operating clock frequencies of recent integrated circuits and in a critical frequency domain (from 30 MHz) in radiated noise, a bypass capacitor can be considered as an inductive low-impedance element. That is to say, the impedance value in a target frequency band is determined by the inductance value. Moreover, the noise reduction effect of a bypass capacitor is actually determined by impedance characteristics including the inductance of wiring between a power supply terminal of an integrated circuit and a bypass capacitor.

However, in the structure shown in FIG. 9, a noise current generated by the operation of the IC 101 flows from the power supply terminal 102 to the power-supply via hole 110 through the first power supply wiring 106. Then, at the intersection point of the power-supply via hole 110 and the inner-layer main power supply plane 108, the noise current branches off to the inner-layer main power supply plane 108 and the bypass capacitor 112 in proportion to their impedance ratio.

In this structure, the parasitic inductance (equivalent series inductance (ESL)) of the bypass capacitor and inductances of the second power supply wiring 111 and the power-supply via hole 110 are provided between the bypass capacitor 112 and the IC 101. Thus, the impedance between the bypass capacitor 112 and the IC 101 is higher than the impedance between the inner-layer main power supply plane 108 and the IC 101, and the current flows into the inner-layer main power supply plane 108, which is likely to serve as an antenna. Accordingly, radiated noise is not effectively suppressed by the bypass capacitor 112.

SUMMARY OF THE INVENTION

The present invention suppresses radiated noise by effectively using a bypass capacitor with a simple arrangement in a printed circuit board that includes power supply wiring of a semiconductor integrated circuit extending through vias to the back face of the printed circuit board opposite to the face of the printed circuit board on which the semiconductor integrated circuit is provided, and that includes the bypass capacitor.

To solve the problems described above, a multilayered printed circuit board according to a first aspect of the present invention includes a first surface layer that includes a semiconductor integrated circuit, a second surface layer that includes a bypass capacitor and that is provided on a face of the multilayered printed circuit board opposite to a face of the multilayered printed circuit board on which the first surface layer is provided, a main power supply wiring layer that is provided in a layer between the first and second surface layers, and a ground layer that is provided in a layer between the first and second surface layers. In the multilayered printed circuit board, one terminal of the bypass capacitor is connected to a midpoint of a wiring path that extends from the main power supply wiring layer to a power supply terminal of the semiconductor integrated circuit, and an impedance of a first wiring path that extends from the main power supply wiring layer to the terminal of the bypass capacitor is higher than an impedance of a second wiring path that extends from the terminal of the bypass capacitor to the power supply terminal of the semiconductor integrated circuit.

Moreover, a multilayered printed circuit board according to a second aspect of the present invention includes a first surface layer that includes a semiconductor integrated circuit, a second surface layer that includes a bypass capacitor and that is provided on a face of the multilayered printed circuit board opposite to a face of the multilayered printed circuit board on which the first surface layer is provided, a main power supply wiring layer that is provided in a layer between the first and second surface layers, and a ground layer that is provided in a layer between the first and second surface layers. In the multilayered printed circuit board, one terminal of the bypass capacitor is connected to a midpoint of a wiring path that extends from the main power supply wiring layer to a power supply terminal of the semiconductor integrated circuit, and an inductance of a first wiring path that extends from the main power supply wiring layer to the terminal of the bypass capacitor is higher than a parasitic inductance in the bypass capacitor.

Moreover, a multilayered printed circuit board according to a third aspect of the present invention includes a first surface layer that includes a semiconductor integrated circuit, a second surface layer that includes a bypass capacitor and that is provided on a face of the multilayered printed circuit board opposite to a face of the multilayered printed circuit board on which the first surface layer is provided, a main power supply wiring layer that is provided in a layer between the first and second surface layers, a ground layer that is provided in a layer between the first and second surface layers, a first power-supply via hole that extends from the first surface layer to the second surface layer and that is not electrically connected to the main power supply wiring layer, a first conductor pattern that is disposed on the first surface layer and that connects the power supply terminal of the semiconductor integrated circuit to the first power-supply via hole, a second power-supply via hole that extends from the second surface layer to the first surface layer and that is electrically connected to the main power supply wiring layer, a second conductor pattern that is disposed on the second surface layer and that connects the first power-supply via hole to the second power-supply via hole, and a ground via hole that extends from the second surface layer to the first surface layer and that is electrically connected to the ground layer. In the multilayered printed circuit board, the second conductor pattern and the ground via hole are connected to one terminal of the bypass capacitor.

The second power-supply via hole may be disposed on the ground via hole side of the perpendicular bisector of the line segment between the first power-supply via hole and the ground via hole, and may be disposed within a circle with its center at the ground via hole and with a radius of $D=2L/e$, where L is the via length and e is the base of the natural logarithm.

According to the present invention, the impedance between the inner-layer main power supply plane and the power supply terminal of the semiconductor integrated circuit is higher than the impedance between the bypass capacitor and the power supply terminal of the semiconductor integrated circuit. Thus, the amount of current flowing into the bypass capacitor increases and the radiated noise is suppressed. That is to say, the bypass capacitor can be effectively used.

In the present invention, the power supply patterns described above are installed in the printed circuit board. Thus, cost reduction can be achieved by preventing a repetition of prototyping due to the radiated noise and a malfunction of devices in product development, and by reducing anti-radiated noise components.

Further features of the present invention will become apparent from the following description of exemplary embodiments with reference to the attached drawings.

DESCRIPTION OF THE EMBODIMENTS

Impedance characteristics between a power supply terminal of an integrated circuit and a bypass capacitor are determined by the parasitic inductance (ESL) of the bypass capacitor and the inductance of wiring between the power supply terminal of the integrated circuit and the bypass capacitor. The parasitic inductance (ESL) of the bypass capacitor is determined by, for example, the shape or the size of a ceramic chip capacitor that is used as the bypass capacitor. In contrast, radiated noise can be suppressed by adjusting inductance values of via holes, wiring, and the like.

To effectively use the bypass capacitor, the impedance between an inner-layer main power supply plane and the power supply terminal of the semiconductor integrated circuit needs to be higher than the impedance between the bypass capacitor and the power supply terminal of the semiconductor integrated circuit. That is to say, at the branch point to the bypass capacitor and to the inner-layer main power supply plane, a high-frequency current generated in the semiconductor integrated circuit is distributed to the bypass capacitor and the inner-layer main power supply plane in proportion to the ratio of the impedance of the bypass capacitor to the impedance of the inner-layer main power supply wiring. Thus, the impedance between the inner-layer main power supply plane and the power supply terminal of the semiconductor integrated circuit is increased by providing an inductance between the main power supply and the branch point to the bypass capacitor and to the main power supply. The impedance between the inner-layer main power supply plane and the power supply terminal of the semiconductor integrated circuit becomes higher than the impedance between the bypass capacitor and the power supply terminal of the semiconductor integrated circuit by adjusting the value of the provided inductance so as to be higher than the parasitic inductance of the bypass capacitor. Thereby, the proportion of the high-frequency current flowing into the bypass capacitor can be increased.

In embodiments according to the present invention, power supply wiring to a first power-supply via hole (a through hole) is shortened as much as possible, the via hole extending from a land on which the power supply terminal of the IC or LSI is mounted to the back face of the printed circuit board; power supply wiring between the first power-supply via hole and the bypass capacitor mounted on the back face of the printed circuit board is shortened as much as possible; a ground via hole is disposed so that the path on which the current flowing into ground through the bypass capacitor reaches a ground terminal of the semiconductor integrated circuit is shortest; the first power-supply via hole, the ground via hole, and a second power-supply via hole are disposed in this order on an approximately straight line, the second power-supply via hole connecting to the inner-layer main power supply wiring extending from the path of power supply wiring passing through the bypass capacitor on the back face of the printed circuit board; and the second power-supply via hole is disposed as close to the ground via hole as possible.

In the embodiments according to the present invention, the first power-supply via hole, which extends from a power supply conductor that is provided on the front face of the printed circuit board and that is connected to the power supply terminal of the IC or LSI to the back face of printed circuit board, is connected to the bypass capacitor provided on the back face of the printed circuit board without connecting to the main power supply wiring extending through the inner layers of the printed circuit board. The wiring passes through the bypass capacitor and connects to the main power supply wiring through the second power-supply via hole.

Moreover, in the embodiments according to the present invention, the ground via hole is disposed close to the first power-supply via hole. The second power-supply via hole is disposed within a circle with its center at the ground via hole and with a radius of $2L/e$, where L is the via length and e is the base of the natural logarithm, and is disposed on the ground via hole side of the perpendicular bisector of the line segment between the first power-supply via hole and the ground via hole.

Next, the embodiments according to the present invention are specifically described.

First Embodiment

Figure 1:
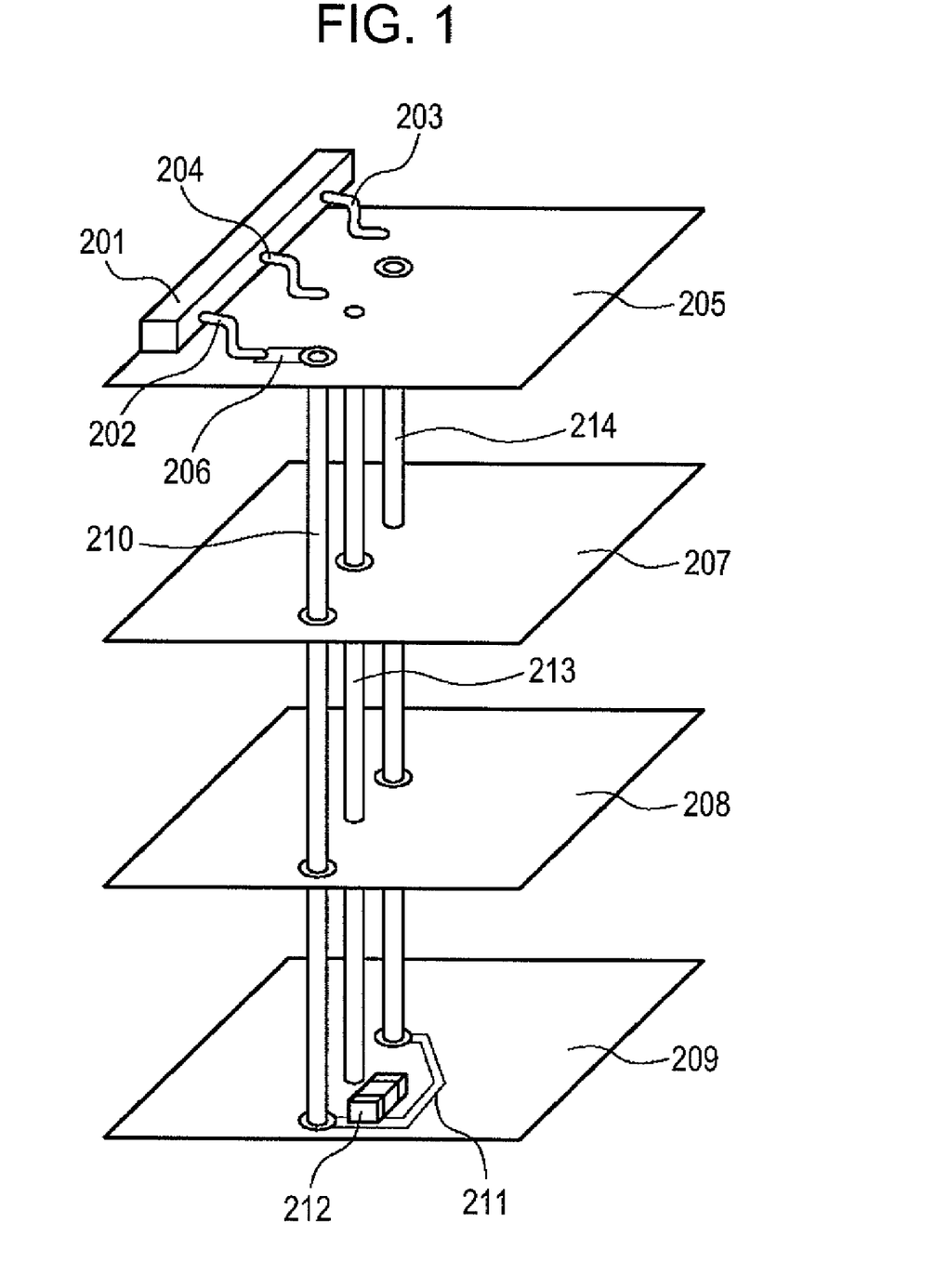
FIG. 1 is a schematic diagram showing a printed circuit board according to a first embodiment of the present invention.

FIG. 1 is a schematic diagram showing a printed circuit board according to a first embodiment of the present invention.

In FIG. 1, the printed circuit board includes an IC 201 that generates noise, a power supply terminal 202 that supplies power to the IC 201, a ground terminal 203 that supplies a reference potential to the IC 201, and an I/O terminal 204 having a predetermined function for the IC 201. The printed circuit board further includes a first surface-layer conductor 205 on which the IC 201 is mounted, and first power supply wiring 206 installed in the first surface-layer conductor 205. The printed circuit board further includes an inner-layer main power supply plane 207 that constitutes a power supply system of the printed circuit board and that is disposed directly under the first surface-layer conductor 205, an inner-layer ground conductor 208, and a second surface-layer conductor 209 on a face of the printed circuit board opposite to a face of the printed circuit board on which the first surface-layer conductor 205 is provided. The printed circuit board further includes a first power-supply via hole 210 that extends from the first surface-layer conductor 205 to the second surface-layer conductor 209, and second power supply wiring 211 that extends to the second surface-layer conductor 209 out of the first power-supply via hole 210. The printed circuit board further includes a bypass capacitor 212 mounted on the second surface-layer conductor 209, a ground via hole 213 that constitutes the shortest path for a current through the bypass capacitor 212 to go back to the ground terminal 203, and a second power-supply via hole 214 that connects the second power supply wiring 211, which passes through a branch path to the bypass capacitor 212, to the inner-layer main power supply plane 207. Although the bypass capacitor 212 is actually disposed on the back face of the second surface-layer conductor 209, the bypass capacitor 212 is disposed on the front face of the second surface-layer conductor 209 in FIG. 1 for the sake of simplifying the illustration.

Figure 2:
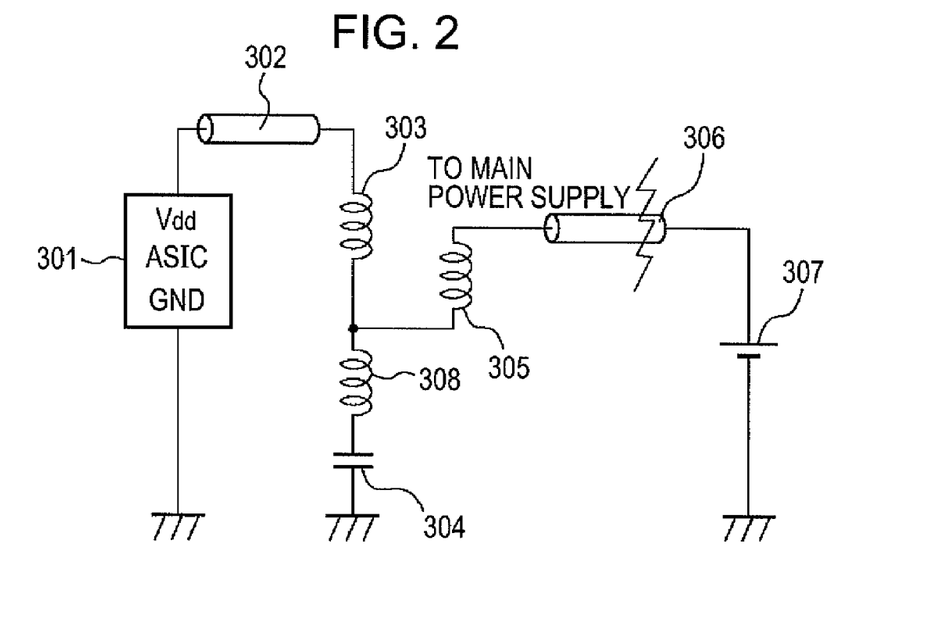
FIG. 2 is an equivalent circuit diagram of the printed circuit board shown in FIG. 1.

FIG. 2 is an equivalent circuit diagram of the printed circuit board shown in FIG. 1. In FIG. 2, an IC unit 301 includes the IC 201, the power supply terminal 202, and the ground terminal 203 shown in FIG. 1. A first transmission line 302 corresponds to the first power supply wiring 206 in FIG. 1. A first inductance 303 corresponds to the first power-supply via hole 210 shown in FIG. 1. A capacitor 304 corresponds to the bypass capacitor 212 shown in FIG. 1. A second inductance 305 corresponds to the inductance of a part in FIG. 1 including a portion of the second power supply wiring 211 from the branch point to the bypass capacitor 212 to the second power-supply via hole 214 and a portion of the second power-supply via hole 214 from the second surface-layer conductor 209 to the inner-layer main power supply plane 207. A second transmission line 306 corresponds to the inner-layer main power supply plane 207 shown in FIG. 1. A direct-current (DC) voltage supply 307 corresponds to a component that supplies voltage to the IC 201. A parasitic inductance (ESL) 308 corresponds to that in the bypass capacitor 212.

In the structure described above, high-frequency noise is generated from the power supply terminal 202 by operating the IC 201. This high-frequency noise reaches the second surface-layer conductor 209 through the first power supply wiring 206 and the first power-supply via hole 210. At this time, the first power-supply via hole 210 passes through a hole provided in the inner-layer main power supply plane 207 and thus does not connect to the inner-layer main power supply plane 207. The second power supply wiring 211 extends to the second surface-layer conductor 209 through the first power-supply via hole 210 and connects to the inner-layer main power supply plane 207 through the second power-supply via hole 214. A DC voltage is supplied to the IC 201 through this path. A terminal of the bypass capacitor 212 at the power supply side is connected to the second power supply wiring 211. A terminal of the bypass capacitor 212 at the ground side is connected to the ground terminal 203 of the IC 201 and the inner-layer ground conductor 208 through the ground via hole 213.

At the point at which the second power supply wiring 211 branches off to the bypass capacitor 212 and to the inner-layer main power supply plane 207, the noise current branches off to the bypass capacitor 212 and to the inner-layer main power supply plane 207 in proportion to the ratio of the impedance at the bypass capacitor 212 side to the impedance at the inner-layer main power supply plane 207 side, as viewed from the branch point. In this case, the impedance at the bypass capacitor 212 side is only the parasitic inductance 308. Thus, in this arrangement, the impedance at the inner-layer main power supply plane 207 side, including the ground via hole 213 and the second power supply wiring 211, is higher than the impedance due to the parasitic inductance 308. Thus, the noise current flows into the path to the bypass capacitor 212 and goes back to the ground terminal 203 of the IC 201 through the ground via hole 213 disposed near the first power-supply via hole 210. Thus, the current flows through the first power-supply via hole 210 from the first surface-layer conductor 205 to the second surface-layer conductor 209, and conversely the current flows through the ground via hole 213 from the second surface-layer conductor 209 to the first surface-layer conductor 205. Moreover, the current flows through the second power-supply via hole 214 from the second surface-layer conductor 209 toward the first surface-layer conductor 205, as in the case of the ground via hole.

Moreover, a mutual inductance is produced by disposing the ground via hole 213 close to the second power-supply via hole 214, through which the respective currents flow in the same direction, thereby increasing the effective inductance of the second power-supply via hole 214. This means that the difference between the impedance at the inner-layer main power supply plane 207 side and the impedance due to the parasitic inductance 308 can be increased by increasing the second inductance 305 shown in FIG. 2. Thus, propagation of the current to the second transmission line 306 is suppressed. Accordingly, the noise current flowing to the inner-layer main power supply plane 207 can be reduced, and the radiated noise can be reduced.

That is to say, in the structure described above, the respective currents flow through the first power-supply via hole and the second power-supply via hole, in opposite directions and in the direction perpendicular to the printed circuit board.

Since the ground via hole serves as the return path of the current passing through the first power-supply via hole and then flowing into the ground through the bypass capacitor, the current flows through the ground via hole in the direction opposite to the current flowing through the first power-supply via hole. Accordingly, the respective currents flow through the ground via hole and the second power-supply via hole in the same direction, and the effective inductance can be increased by the mutual inductance between the ground via hole and the second power-supply via hole.

Here, the relationship between the distance between the ground via hole and the second power-supply via hole and the mutual inductance generated between these two conductors is represented by the following approximate equation:

$$M = 2L(\ln(2L/d) - 1) \times 10^{-7} \quad (1)$$

where M is the mutual inductance, L is the via length, and d is the distance between vias. When a region where the mutual inductance M is positive according to equation (1) is approximately regarded as the region where the mutual inductance acts, $\ln(2L/d)$ must be equal to or higher than one for the mutual inductance to act. Thus, on condition that the via distance d is equal to $2L/e$ or less, where e is the base of the natural logarithm, the mutual inductance acts in that region.

In the structure described above, the respective currents flow through the first power-supply via hole and the ground via hole in opposite directions, and thus the effective inductance of the first power-supply via hole is decreased by the effect of mutual inductance between two conductors through which respective currents flow in opposite directions. Stabilization of the power supply potential and the radiated-noise reduction effect by the bypass capacitor are improved by decreasing the inductance between the power supply terminal of the semiconductor integrated circuit and the bypass capacitor, i.e., by decreasing the impedance. Since a mutual inductance that acts between two parallel conductors is approximately represented by equation (1), the mutual inductance acts in a region on condition that the value represented by equation (1) is positive. Thus, the via distance d must be equal to $2L/e$ or less.

As approximately shown by equation (1), as the ground via hole 213 becomes closer to the second power-supply via hole 214, the mutual inductance, which acts between these two conductors, becomes larger. Thus, the ground via hole 213 should be as close to the second power-supply via hole 214 as possible. The mutual inductance acts in a region on condition that the mutual inductance M represented by equation (1) is positive. Thus, the maximum via distance is $2L/e$ for the mutual inductance to act.

Figure 3:
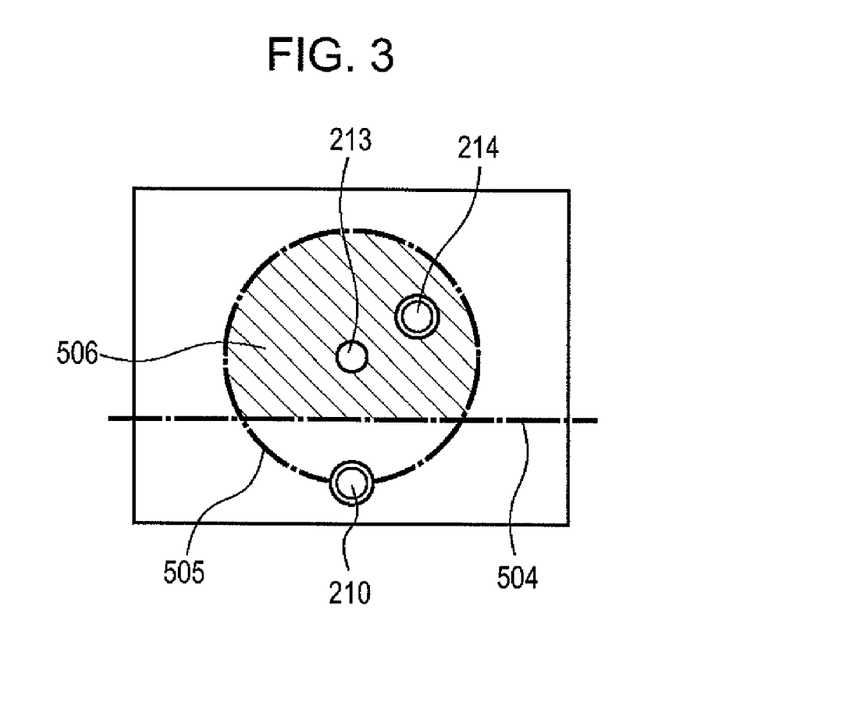
FIG. 3 is a schematic diagram showing the arrangement of power-supply via holes and a ground via hole in the first embodiment.

FIG. 3 is a plan view of the printed circuit board showing the arrangement of the first power-supply via hole, the second power-supply via hole, and the ground via hole, shown in FIG. 1. In FIG. 3, reference numeral 210 denotes the first power-supply via hole, reference numeral 213 denotes the ground via hole, and reference numeral 214 denotes the second power-supply via hole. Reference numeral 504 denotes a perpendicular bisector of the line segment between the first power-supply via hole 210 and the ground via hole 213, reference numeral 505 denotes a circle with its center at the ground via hole 213 and with a radius of $2L/e$, and reference numeral 506 denotes a region where the second power-supply via hole 214 needs to be disposed.

The mutual inductance acts in the region between the ground via hole 213 and the second power-supply via hole 214 so long as the via distance is equal to $2L/e$ or less. The plot of such a region is represented by the region within the circle 505 in FIG. 3. To avoid the effect of mutual inductance between the second power-supply via hole 214 and the first power-supply via hole 210, at least the distance between the second power-supply via hole 214 and the ground via hole 213 must be shorter than the distance between the second power-supply via hole 214 and the first power-supply via hole 210. That is to say, in FIG. 3, the second power-supply via hole 214 must be disposed on the ground via hole 213 side of the perpendicular bisector 504. The plot of a region on the printed circuit board that satisfies the two conditions described above is represented by the region 506 in FIG. 3.

Figure 4:
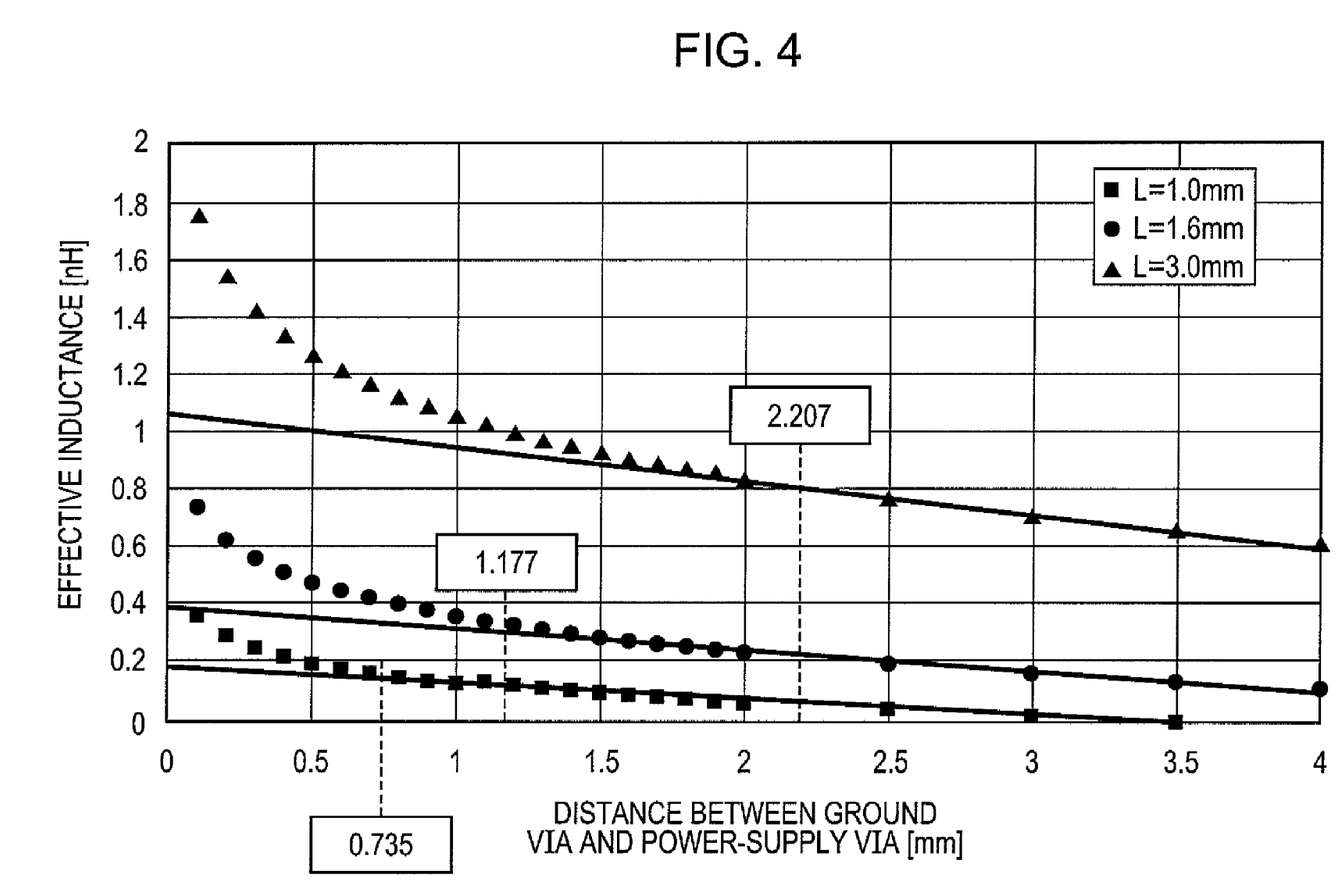
FIG. 4 is a graph showing the relationship between the distance between a ground via hole and a second power-supply via hole and the mutual inductance generated between these two conductors in the first embodiment.

FIG. 4 is a graph showing the relationship between the distance between the ground via hole and the second power-supply via hole and the mutual inductance generated between these two conductors in cases where L=1.0 mm, L=1.6 mm, and L=3.0 mm. The value of 2L/e in the case where L=1.0 mm is 0.735, the value of 2L/e in the case where L=1.6 mm is 1.177, and the value of 2L/e in the case where L=3.0 mm is 2.207. As is apparent from FIG. 4, when the distance between the second power-supply via hole and the ground via hole is equal to 2L/e or less, the effective inductance can be efficiently increased.

That is to say, the second power-supply via hole is disposed close to the ground via hole so that the via distance d is equal to 2L/e or less, and a predetermined distance is kept between the second power-supply via hole and the first power-supply via hole, the current of which flows in the direction opposite to the current flowing through the second power-supply via hole. Thus, a decrease in the effective inductance of the second power-supply via hole due to the mutual inductance between the second power-supply via hole and the first power-supply via hole can be avoided, and the effective inductance of the second power-supply via hole due to the mutual inductance between the second power-supply via hole and the ground via hole can be simultaneously increased, thereby reducing the radiated noise.

Since the current flowing through the second power-supply via hole passes through the bypass capacitor, the amplitude of this current is less than that of the current flowing through the first power-supply via hole. Even when the second power-supply via hole is disposed close to the ground via hole, the current flow direction in the ground via hole is strongly affected by the first power-supply via hole. Thus, in practice, the respective currents do not flow through the ground via hole and the second power-supply via hole in opposite directions.

Moreover, when the first power-supply via hole 210, the ground via hole 213, and the second power-supply via hole 214 are disposed in this order on an approximately straight line, as shown in FIG. 1, the influence of the first power-supply via hole 210 on the second power-supply via hole 214 in the same wiring area can be minimized. In addition, the mounting area can be reduced.

Moreover, in this embodiment, since the inner-layer main power supply plane 207 is disposed directly under the first surface-layer conductor 205, the length of the second power-supply via hole 214, which draws power from the second surface-layer conductor 209 to the inner-layer main power supply plane 207, is large. Thus, the second inductance 305 shown in FIG. 2 can be increased, thereby effectively suppressing the radiated noise.

Second Embodiment

Figure 5:
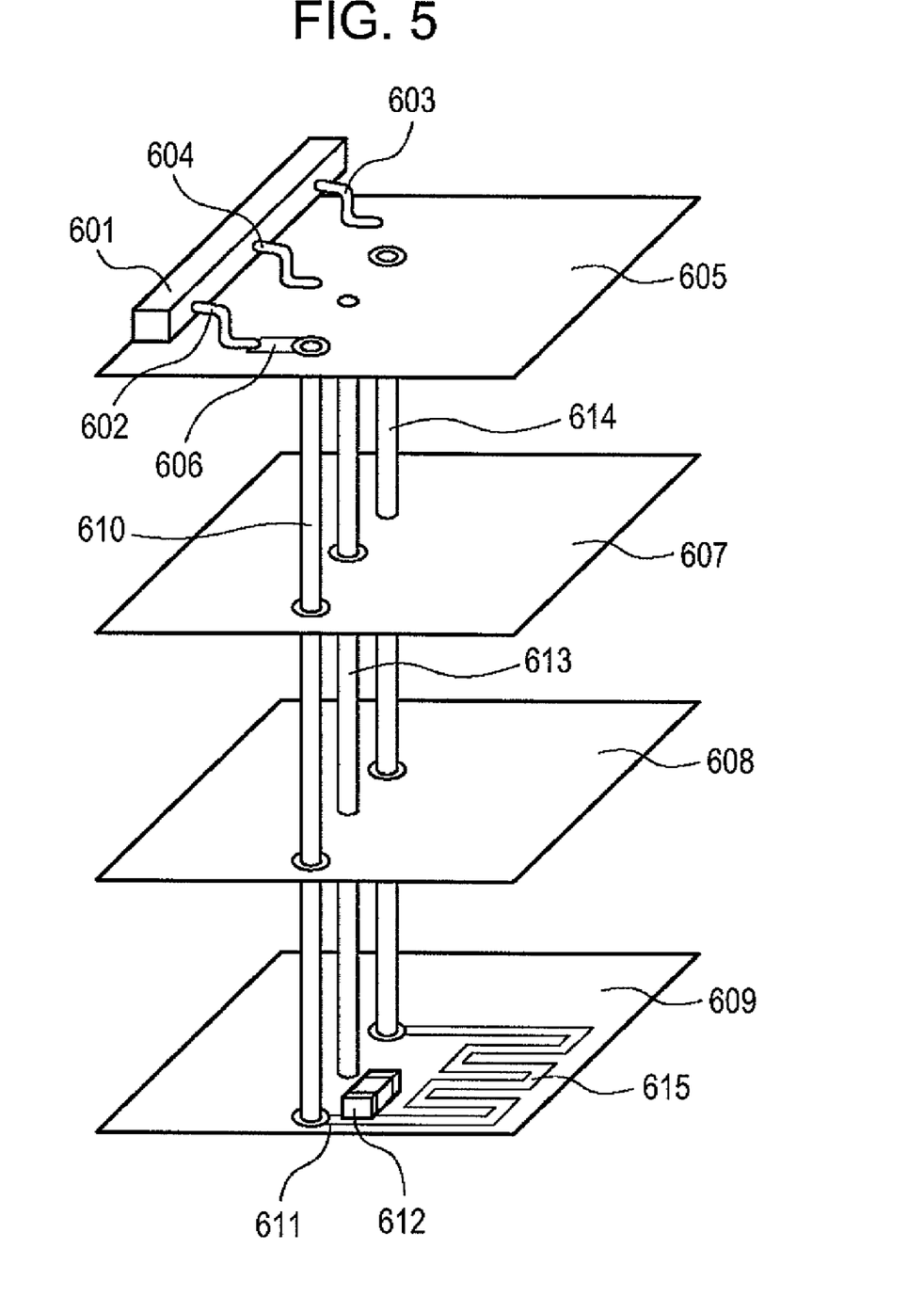
FIG. 5 is a schematic diagram showing a printed circuit board according to a second embodiment.

FIG. 5 is a schematic diagram showing a second embodiment according to the present invention. In FIG. 5, a printed circuit board includes an IC 601 that generates noise, a power supply terminal 602 that supplies power to the IC 601, a ground terminal 603 that supplies a reference potential to the IC 601, and an I/O terminal 604 having a predetermined function for the IC 601. The printed circuit board further includes a first surface-layer conductor 605 on which the IC 601 is mounted, and first power supply wiring 606 installed in the first surface-layer conductor 605. The printed circuit board further includes an inner-layer main power supply plane 607 that constitutes a power supply system of the printed circuit board and that is disposed directly under the first surface-layer conductor 605, an inner-layer ground conductor 608, and a second surface-layer conductor 609 on a face of the printed circuit board opposite to a face of the printed circuit board on which the first surface-layer conductor 605 is provided. The printed circuit board further includes a first power-supply via hole 610 that extends from the first surface-layer conductor 605 to the second surface-layer conductor 609, and second power supply wiring 611 that extends to the second surface-layer conductor 609 out of the first power-supply via hole 610. The printed circuit board further includes a bypass capacitor 612 mounted on the second surface-layer conductor 609, a ground via hole 613 that constitutes the shortest path for a current through the bypass capacitor 612 to go back to the ground terminal 603, a second power-supply via hole 614, and a meandering wiring pattern 615 provided on a portion of the second power supply wiring 611 from the position of the bypass capacitor 612 to the second power-supply via hole 614. The second power-supply via hole 614 connects the meandering wiring pattern 615 to the inner-layer main power supply plane 607.

In the structure described above, the meandering wiring pattern 615 acts as an inductance. Thus, the value of the inductance of a portion including the second power-supply via hole 614 and the meandering wiring pattern 615 is higher than that of the parasitic inductance of the bypass capacitor 612. Accordingly, the impedance between the inner-layer main power supply plane 607 and the power supply terminal of the IC 601 can be adjusted so as to be higher than the impedance between the bypass capacitor 612 and the power supply terminal of the IC 601.

As described above, the area including the bypass capacitor is designed so that the inductance of a portion extending from the power supply terminal of the semiconductor integrated circuit to the bypass capacitor is reduced. Thus, the inductance of the portion extending from the position of the bypass capacitor to the main power supply is increased to suppress a change in power supply potential of the semiconductor integrated circuit and the radiated noise.

Third Embodiment

Figure 6:
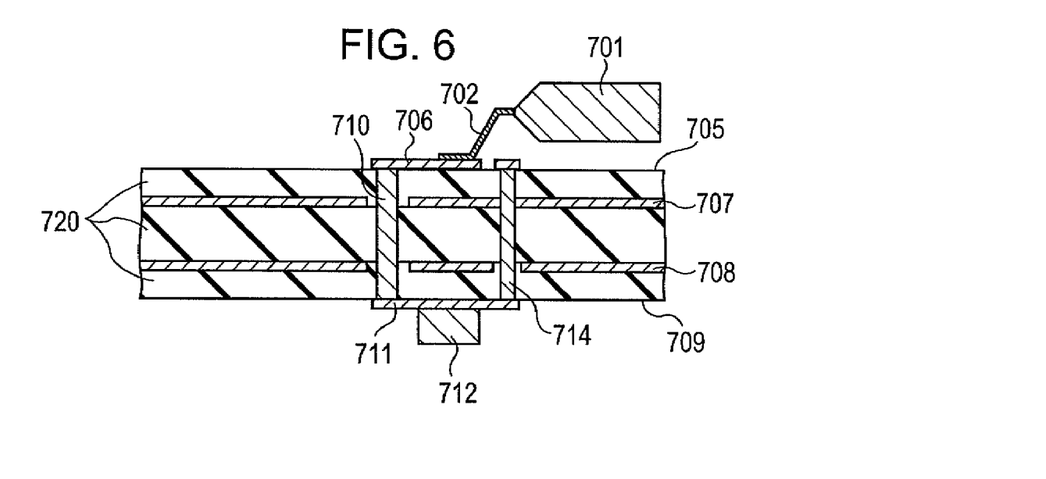
FIG. 6 is a schematic diagram showing a printed circuit board according to a third embodiment.

FIG. 6 is a sectional view showing the structure of a printed circuit board according to a third embodiment of the present invention. A power supply pin 702 of an IC 701 of the QFP type or small outline package (SOP) type is attached to first power supply wiring 706 provided on the printed circuit board by soldering. Second power supply wiring 711 for attaching a bypass capacitor 712 is provided on a second surface-layer conductor 709 that is provided on a face of the printed circuit board opposite to a face of the printed circuit board on which a first surface-layer conductor 705 is provided.

The printed circuit board includes four wiring layers having an insulating substrate 720. First to fourth layers are disposed in this order from the top. An inner-layer main power supply plane 707 is provided in the second layer, and an inner-layer ground plane 708 is provided in the third layer.

A second power-supply via hole 714 with an inside diameter less than 0.4 mm connects the inner-layer main power supply plane 707 to the bypass capacitor 712, while detouring around the inner-layer ground plane 708. A first power-supply via hole 710 with an inside diameter of 0.4 mm or more connects the bypass capacitor 712 to the first power supply wiring 706 of the IC 701.

In this way, in this embodiment, the inductance of the second power-supply via hole 714 is increased by adjusting the inside diameter of the second power-supply via hole 714 so as to be smaller than that of the first power-supply via hole 710. Thus, the impedance between the inner-layer main power supply plane 707 and a power supply terminal of the IC 701 can be higher than the impedance between the bypass capacitor 712 and the power supply terminal of the IC 701.

In this way, the bypass capacitor can effectively work by designing the wiring path so that the current is provided to the integrated circuit mainly from the bypass capacitor, and not directly from the main power supply wiring.

Fourth Embodiment

Figure 7:
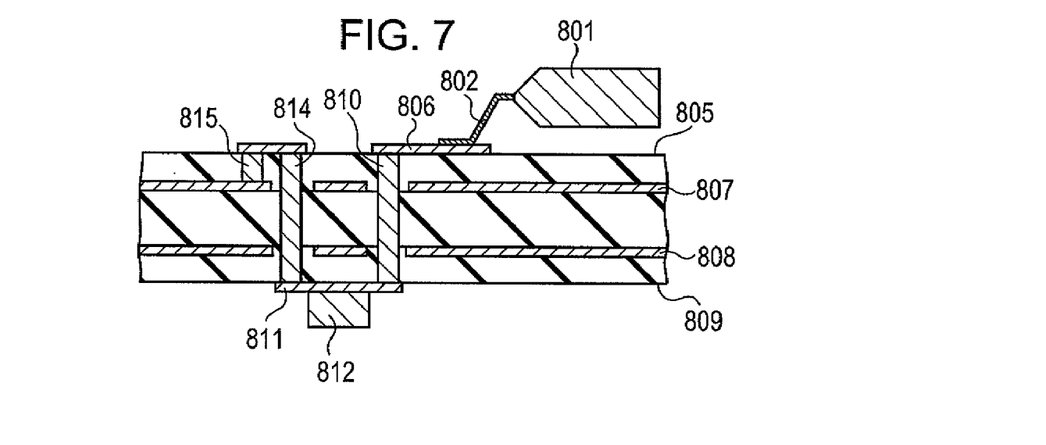
FIG. 7 is a schematic diagram showing a printed circuit board according to a fourth embodiment.

FIG. 7 is a schematic diagram showing a fourth embodiment according to the present invention. In FIG. 7, the printed circuit board includes an IC 801 that generates noise and a power supply terminal 802 that supplies power to the IC 801. The printed circuit board further includes a first surface-layer conductor 805 on which the IC 801 is mounted, and first power supply wiring 806 installed in the first surface-layer conductor 805. The printed circuit board further includes an inner-layer main power supply plane 807 that constitutes a power supply system of the printed circuit board and that is disposed directly under the first surface-layer conductor 805, an inner-layer ground plane 808, and a second surface-layer conductor 809 on a face of the printed circuit board opposite to a face of the printed circuit board on which the first surface-layer conductor 805 is provided. The printed circuit board further includes a first power-supply via hole 810 that extends from the first surface-layer conductor 805 to the second surface-layer conductor 809, and second power supply wiring 811 that extends to the second surface-layer conductor 809 out of the first power-supply via hole 810. The printed circuit board further includes a bypass capacitor 812 mounted on the second surface-layer conductor 809 and a second power-supply via hole 814 that connects the second power supply wiring 811 to the inner-layer main power supply plane 807. The second power-supply via hole 814 extends from the second surface-layer conductor 809 to the first surface-layer conductor 805 and then connects to the inner-layer main power supply plane 807 through a third power-supply via hole 815 disposed next to the second power-supply via hole 814.

As described above, in this embodiment, the via holes have different lengths so that the impedance between the inner-layer main power supply plane 807 and the power supply terminal of the IC 801 is higher than the impedance between the bypass capacitor 812 and the power supply terminal of the IC 801. Thus, the bypass capacitor can effectively work by designing the wiring path so that the current is provided to the integrated circuit mainly from the bypass capacitor, and not directly from the main power supply wiring.

Fifth Embodiment

Figure 8:
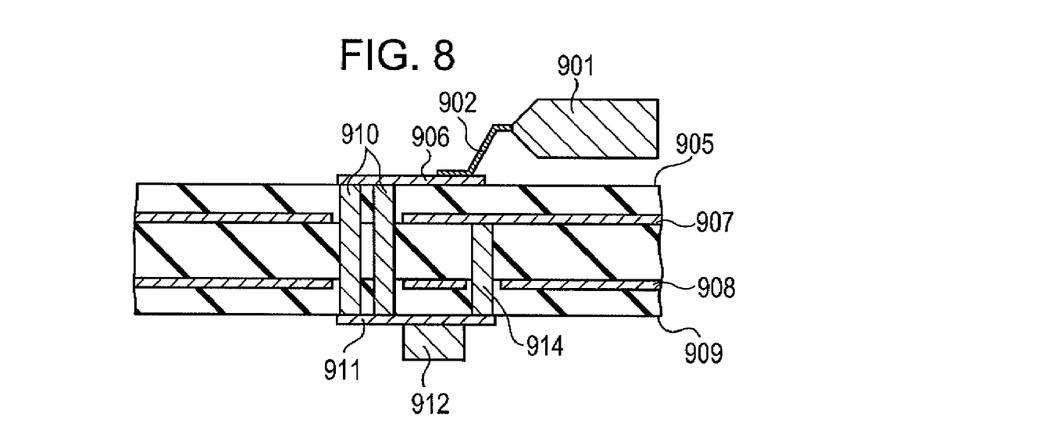
FIG. 8 is a schematic diagram showing a printed circuit board according to a fifth embodiment.

FIG. 8 is a schematic diagram showing a fifth embodiment according to the present invention. In FIG. 8, the printed circuit board includes an IC 901 that generates noise and a power supply terminal 902 that supplies power to the IC 901. The printed circuit board further includes a first surface-layer conductor 905 on which the IC 901 is mounted, and first power supply wiring 906 installed in the first surface-layer conductor 905. The printed circuit board further includes an inner-layer main power supply plane 907 that constitutes a power supply system of the printed circuit board and that is disposed directly under the first surface-layer conductor 905, an inner-layer ground conductor 908, and a second surface-layer conductor 909 on a face of the printed circuit board opposite to a face of the printed circuit board on which the first surface-layer conductor 905 is provided. The printed circuit board further includes first power-supply via holes 910 that extend from the first surface-layer conductor 905 to the second surface-layer conductor 909, the first power-supply via holes 910 being two parallel vias, and second power supply wiring 911 that extends to the second surface-layer conductor 909 out of the first power-supply via holes 910. The printed circuit board further includes a bypass capacitor 912 mounted on the second surface-layer conductor 909 and a second power-supply via hole 914 that connects the second power supply wiring 911 to the inner-layer main power supply plane 907.

As described above, in this embodiment, the two first power-supply via holes 910 extend through the printed circuit board in parallel and connect the front face of the printed circuit board to the back face. That is to say, the first power-supply via holes 910 can be considered as two combined parallel via holes, and thus can be considered to have the same impedance as one via hole with a large inside diameter corresponding to the total sectional area of the two via holes. Thus, the impedance between the inner-layer main power supply plane 907 and the power supply terminal of the IC 901 can be higher than the impedance between the bypass capacitor 912 and the power supply terminal of the IC 901.

In this way, the bypass capacitor can effectively work by designing the wiring path so that the current is provided to the integrated circuit mainly from the bypass capacitor, and not directly from the main power supply wiring.

Other Embodiments

While through holes are used as the via holes in the embodiments described above, the structure of the via holes according to the present invention is not limited to these embodiments. The same advantages can be achieved even with blind via holes, inner via holes, or the like.

Moreover, while the printed circuit board includes four layers in the embodiments described above, the present invention is applicable regardless of the number of layers so long as the printed circuit board includes two or more layers. It is apparent that the same advantages can be achieved.

Moreover, while the integrated circuit and the bypass capacitor are provided on the different faces of the printed circuit board in the embodiments described above, the present invention is applicable even in a case where the integrated circuit and the bypass capacitor are provided on the same face of the printed circuit board.

The present invention can be applied to surface-mounted printed circuit boards including integrated circuits and bypass capacitors and the equivalents, for example, BGA interposer boards. The present invention can be suitably applied to printed circuit boards used in electronic devices, such as computers.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

What is claimed is:

1. A multilayered printed circuit board comprising:
   a first surface layer that includes a semiconductor integrated circuit;
   a second surface layer that includes a bypass capacitor and that is provided on a face of the multilayered printed circuit board opposite to a face of the multilayered printed circuit board on which the first surface layer is provided;
   a main power supply wiring layer that is provided in a layer between the first and second surface layers;
   a ground layer that is provided in a layer between the first and second surface layers;
   a first power-supply via hole that extends from the first surface layer to the second surface layer and that is not electrically connected to the main power supply wiring layer;
   a first conductor pattern that is disposed on the first surface layer and that connects the power supply terminal of the semiconductor integrated circuit to the first power-supply via hole;
   a second power-supply via hole that extends from the second surface layer to the first surface layer and that is electrically connected to the main power supply wiring layer;
   a second conductor pattern that is disposed on the second surface layer and that connects the first power-supply via hole to the second power-supply via hole; and
   a ground via hole that extends from the second surface layer to the first surface layer and that is electrically connected to the ground layer,
   wherein the second conductor pattern and the ground via hole are connected to one terminal of the bypass capacitor.

2. The multilayered printed circuit board according to claim 1, wherein the second power-supply via hole is disposed on the ground via hole side of a perpendicular bisector of the line segment between the first power-supply via hole and the ground via hole, and is disposed within a circle with its center at the ground via hole and with a radius of $D=2L/e$, where L is the via length and e is the base of the natural logarithm.

3. The multilayered printed circuit board according to claim 1, wherein the second power-supply via hole is disposed on a straight line that passes through the first power-supply via hole and the ground via hole.

4. The multilayered printed circuit board according to claim 1, wherein the second conductor pattern includes a meandering portion between the bypass capacitor and the second power-supply via hole.

5. The multilayered printed circuit board according to claim 1, wherein an inside diameter of the first power-supply via hole is larger than an inside diameter of the second power-supply via hole.

6. A multilayered printed circuit board comprising:
   a first surface layer that includes a semiconductor integrated circuit;
   a second surface layer that includes a bypass capacitor and that is provided on a face of the multilayered printed circuit board opposite to a face of the multilayered printed circuit board on which the first surface layer is provided;
   a main power supply wiring layer that is provided in a layer between the first and second surface layers;
   a ground layer that is provided in a layer between the first and second surface layers;
   first power-supply via holes that extend from the first surface layer to the second surface layer and that are not electrically connected to the main power supply wiring layer;
   a first conductor pattern that is disposed on the first surface layer and that connects the power supply terminal of the semiconductor integrated circuit to the first power-supply via holes;
   at least one second power-supply via hole that extends from the second surface layer to the first surface layer and that is electrically connected to the main power supply wiring layer;
   a second conductor pattern that is disposed on the second surface layer and that connects the first power-supply via holes to the at least one second power-supply via hole; and
   a ground via hole that extends from the second surface layer to the first surface layer and that is electrically connected to the ground layer,
   wherein the second conductor pattern and the ground via hole are connected to one terminal of the bypass capacitor, and the number of the first power-supply via holes is larger than the number of the at least one second power-supply via hole.

7. The multilayered printed circuit board according to claim 6, wherein the length of the at least one second power-supply via hole is larger than the length of the first power-supply via holes.

8. A multilayered printed circuit board comprising:
   a first surface layer that includes a semiconductor integrated circuit;
   a second surface layer that includes a bypass capacitor and that is provided on a face of the multilayered printed circuit board opposite to a face of the multilayered printed circuit board on which the first surface layer is provided;
   a main power supply wiring layer that is provided in a layer between the first and second surface layers;
   a ground layer that is provided in a layer between the first and second surface layers;
   a first power-supply via hole that extends from the first surface layer to the second surface layer and that is not electrically connected to the main power supply wiring layer;
   a first conductor pattern that is disposed on the first surface layer and that connects the power supply terminal of the semiconductor integrated circuit to the first power-supply via hole;
   a second power-supply via hole that extends from the second surface layer to the first surface layer and that is electrically connected to the main power supply wiring layer;
   a second conductor pattern that is disposed on the second surface layer and that connects the first power-supply via hole to the second power-supply via hole; and
   a ground via hole that extends from the second surface layer to the first surface layer and that is electrically connected to the ground layer,
   wherein the second conductor pattern and the ground via hole are connected to one terminal of the bypass capacitor, and an impedance of a first wiring path that extends from the main power supply wiring layer to the terminal of the bypass capacitor is higher than an impedance of a second wiring path that extends from the terminal of the bypass capacitor to the power supply terminal of the semiconductor integrated circuit.

9. A multilayered printed circuit board comprising:

a first surface layer that includes a semiconductor integrated circuit;

a second surface layer that includes a bypass capacitor and that is provided on a face of the multilayered printed circuit board opposite to a face of the multilayered printed circuit board on which the first surface layer is provided;

a main power supply wiring layer that is provided in a layer between the first and second surface layers;

a ground layer that is provided in a layer between the first and second surface layers;

a first power-supply via hole that extends from the first surface layer to the second surface layer and that is not electrically connected to the main power supply wiring layer;

a first conductor pattern that is disposed on the first surface layer and that connects the power supply terminal of the semiconductor integrated circuit to the first power-supply via hole;

a second power-supply via hole that extends from the second surface layer to the first surface layer and that is electrically connected to the main power supply wiring layer;

a second conductor pattern that is disposed on the second surface layer and that connects the first power-supply via hole to the second power-supply via hole; and a ground via hole that extends from the second surface layer to the first surface layer and that is electrically connected to the ground layer, wherein the second conductor pattern and the ground via hole are connected to one terminal of the bypass capacitor, and an inductance of a first wiring path that extends from the main power supply wiring layer to the terminal of the bypass capacitor is higher than a parasitic inductance in the bypass capacitor.

* * * * *